United States Patent [19]

Dennison et al.

[11] Patent Number: 4,729,119
[45] Date of Patent: Mar. 1, 1988

[54] APPARATUS AND METHODS FOR PROCESSING DATA THROUGH A RANDOM ACCESS MEMORY SYSTEM

[75] Inventors: Larry R. Dennison, Norwood; Steven E. Golson, Boston, both of Mass.

[73] Assignee: General Computer Corporation, Cambridge, Mass.

[21] Appl. No.: 612,565

[22] Filed: May 21, 1984

[51] Int. Cl.⁴ .............................................. G11C 8/00
[52] U.S. Cl. .................................. 365/230; 340/798; 365/63; 365/242
[58] Field of Search ................ 365/189, 230, 63, 69, 365/72, 242; 340/798, 799

[56] References Cited

U.S. PATENT DOCUMENTS

| | | |
|---|---|---|
| 4,112,422 | 9/1978 | Mayer et al. . |
| 4,116,444 | 9/1978 | Mayer et al. . |
| 4,296,476 | 10/1981 | Mayer et al. . |
| 4,324,401 | 4/1982 | Stubben et al. . |
| 4,419,746 | 12/1983 | Hunter et al. ..................... 365/230 |
| 4,435,779 | 3/1984 | Mayer et al. . |
| 4,435,792 | 3/1984 | Bechtolsheim . |
| 4,489,403 | 12/1984 | Bono ................................ 365/230 |
| 4,571,706 | 2/1986 | Iwahashi et al. ................. 365/200 |

*Primary Examiner*—James W. Moffitt
*Attorney, Agent, or Firm*—Hosier & Sufrin, Ltd.

[57] ABSTRACT

Apparatus and methods are disclosed for providing an increased flexibility and rate in processing data in a random access memory (RAM) system. The apparatus comprises, in a first embodiment, a switching circuit which is coupled to the word lines of the RAM array and which is selectively operable in two modes. The switching circuit operates in a first mode to transmit word line signals to a single row of memory cells in the RAM array in accordance with principles well known in the prior art. The switching circuit is responsive to a control circuit, and operates in a second mode to alter, along the row of memory cells in the RAM array, the word line signal path, to provide simultaneous accessing of portions of at least two adjacent rows of memory cells in the RAM array. Such simultaneous accessing allows the processing of more data through the memory system that was previously possible in accordance with principles known in the prior art.

10 Claims, 6 Drawing Figures

APPARATUS AND METHODS FOR PROCESSING DATA THROUGH A RANDOM ACCESS MEMORY SYSTEM

BACKGROUND OF THE INVENTION

The present invention relates generally to digital computer memory applications, and more particularly, to an improved apparatus and methods for processing data in a random access memory (RAM) system. The improved apparatus and method enable the processing of increased quantities of data through the RAM system during a given period of time as compared to conventional systems.

Nearly all computer systems require some form of a temporary memory storage device in order to effectively execute programs and process data. In the prior art, as exemplified by the methods and systems disclosed in U.S. Pat. No. 4,324,401 to Stubben, et al. (hereinafter referred to as the "'401 patent"), a staging, or line, RAM was used to store video graphics data for one horizontal scan line of video display. The teachings of the '401 patent enabled a number of movable objects to be displayed at any horizontal location on a video display screen without expericening masking effects as was common under prior art systems exemplified by U.S. Pat. No. 4,116,444 to Mayer, et al. (hereinafter referred to as the "'444 patent"), While the '401 patent represented an advance over the prior art, it has some important drawbacks. For example, the number of movable objects which could be displayed on a given horizontal scan line is severely limited by the strict time constraints typical of video display systems. Specifically, having only one line RAM necessitates the writing of graphics data only during the horizontal blanking period, since the line RAM must output data during the visible display period. The timing characteristics of the '401 patent can be improved by the standard technique of employing double buffered line RAMS. Additionally, while it is clear that a pixel of graphics display can be represented by more than one bit of data, it would also be advantageous to process through the RAM system graphics data representing more than one pixel per write cycle, which is not possible with the methods and system disclosed by the '401 patent.

A more efficient apparatus for processing graphics, or pixel, data through a RAM is disclosed in U.S. Pat. No. 4,435,792 to Bechtolsheim (hereinafter referred to as the '792 patent). The apparatus disclosed in the '792 patent enabled the writing of data representing more than one pixel per write cycle. Specifically, the '792 apparatus teaches the ability to read, modify and write a word of sixteen bits of data, representing sixteen pixels of display during a single memory cycle. Additionally, the use of shifters to align the data on an arbitrary bit boundary and sequentially addressing a plurality of memory words enables the sixteen bits of data representing sixteen pixels of display to be written in overlapping word boundaries. However, in order to prevent masking effects with the apparatus disclosed in the '792 patent, it is required to perform a read-modify-write (RMW) operation. The need to perform a RMW operation requires additional time and results in the display of fewer graphic objects on a given horizontal scan line. Further, while the '792 patent teaches the use of a frame buffer, which adds flexibility in graphics display, it also adds excessive cost in memory requirements and is unnecessary in many video applications.

The need exists to provide inexpensive and efficient means for processing data through RAM systems. For example, it would be advantageous to provide means for processing data representing more than one pixel per write cycle to arbitrary bit boundaries without the need to perform read-modify-write operations.

SUMMARY OF THE INVENTION

It is, therefore, a primary object of the present invention to provide improved apparatus and methods which enable the efficient processing of large amounts of data through a random access memory (RAM) system.

It is another object of the invention to provide such an apparatus and methods which overcome masking effects of prior art video display systems without requiring a read-modify-write operation.

It is another object of the invention to provide such an apparatus and methods which enable the writing into a RAM array of graphics data corresponding to more than one pixel of display during a single write cycle.

It is another object of the invention to provide such an apparatus and methods which enable a word of graphics data representng more than one pixel to be written into a memory array aligned on an arbitrary pixel boundary.

It is another object of the invention to provide such an apparatus and methods which allow greater flexibility in processing data through a RAM system by simultaneously accessing at least two adjacent rows of memory cells in a RAM array.

It is another object of the invention to provide a dual-mode memory system which is selectively operable in a first mode under principles well known in the prior art, and in a second mode in accordance with improved methods which enable the efficient reading into and writing from a RAM array of great quantities of data.

It is another object of the invention to provide an apparatus and methods for efficiently processing data through a RAM system in order to improve the quality of graphics displayed on a video display screen or other imaging device.

The above and other objects are achieved by an improved apparatus for processing data through a random access memory (RAM) system. The RAM system typically includes a RAM array having a plurality of rows and columns of memory cells. Each row of memory cells is coupled by a word line to a row-enabling circuit. Each column of memory cells is coupled by a data line to a column-enabling circuit. The apparatus comprises a switching circuit coupled to the word lines between two columns of memory cells. The switching circuit is selectively operable to alter the word line signal path to simultaneously access portions of at least two rows of memory cells when a single word line is enable.

The apparatus is selectively operable in either of two modes. A first mode is selected when a word of data is to be stored to only one row of memory cells during a single write cycle. Alternatively, a second mode is selected when the word of data is to be stored to portions of two rows of memory cells during a single write cycle.

The above and other objects are also achieved by a method for efficiently processing data through a RAM system. As above, the RAM system typically includes a RAM array with plural rows and columns of memory cells coupled to appropriate enabling circuitry by word and data lines. The method comprises the step of determing whether a word of data needs to be stored to portions of two rows of memory cells in the RAM array. A switching circuit is activated to alter the word line signal path to access the portions of the two rows of memory cells to which the data will be stored. The altered word line is signaled to activate the portions of the two rows of memory cells. The data lines are enabled to simultaneously store data during a single write cycle to the activated portions of the two rows of memory cells.

Other aspects of the invention will be appreciated by those skilled in the art after a reading of the detailed disclosure of the present invention as set forth below.

DESCRIPTION OF THE DRAWINGS

The novel features of this invention are set forth with particularity below in the claims. The invention, together with its objects and its advantages, are better understood after referring to the following description and accompanying figures. Throughout the figures, the same reference numerals refer to the same elements.

DETAILED DESCRIPTION

Figure 1:
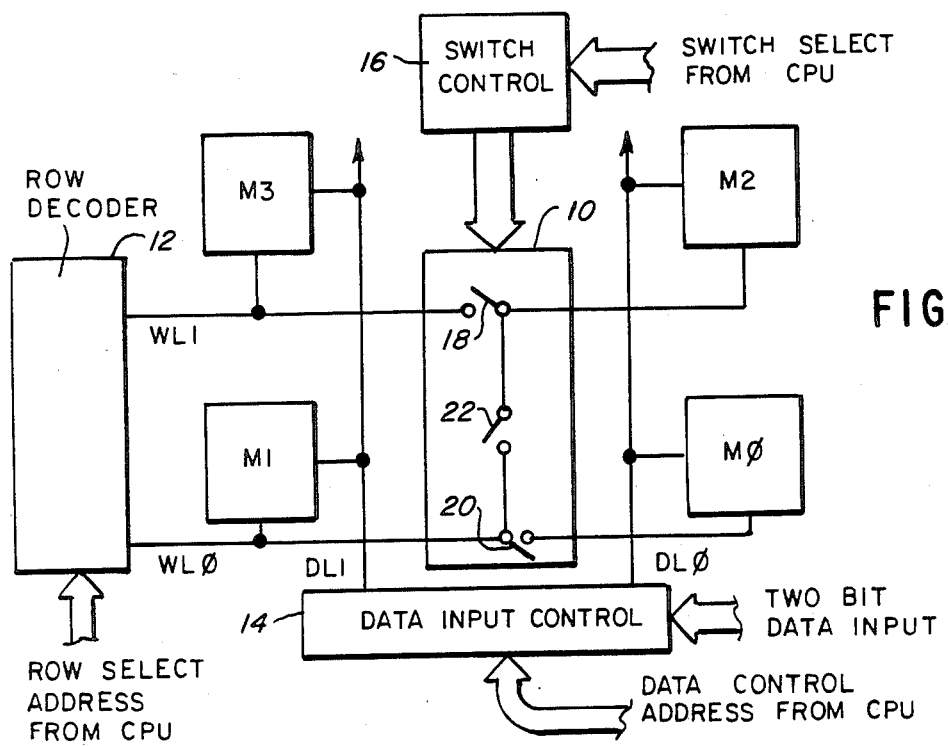
FIG. 1 depicts in simplified schematic form the inventive switching means interposed between one pair of adjacent columns of memory cells in a RAM array.

As discussed above, the need exists to provide means for more efficiently processing groups of data through RAM systems. Shown in FIG. 1 are the pertinent portions of a RAM system configured with the inventive switching means 10 for altering word line signal paths in a RAM array. While FIG. 1 depicts a two-row by two-column (2×2) RAM array, the principles and advantages of the invention as discussed below are similarly applicable to RAM arrays comprising many more rows and/or columns of memory cells.

The switching means 10 is coupled to word lines WL0 and WL1 between the two columns of memory cells M3, M1 and M2, M0. Word line WL0 is coupled to a row decoder 12 and to the first row of memory cells M0, M1. Similarly, word line WL1 is coupled to the row decoder 12 and to the second row of memory cells M2, M3. The row decoder 12 is ultimately controlled by a row select address emanating from a central processing unit (CPU), now shown. Data line DL0 is coupled to a data input control circuit 14 and to the first column of memory cells M0, M2. In the same manner, data line DL1 is coupled to the data input control circuit 14 and to the second column of memory cells M1, M3. The data input control circuit 14, described in more detail below, comprises the various means for temporarily receiving, holding and realigning the data before it is stored to the respective memory cells in the RAM array. The data input control circuit 14 is itself ultimately controlled by an address emanating from the CPU. Since, in this exemplary embodiment, the RAM array is a 2×2 array, data is loaded into the input control circuit 14 in words of two bits via a two bit data input bus.

The switching means 10 is coupled to a switch control circuit 16, which in turn receives its instructions from the CPU via a switch select address. The switching means 10 includes switches 20 and 18 coupled to word lines WL0 and WL1, respectively, and to each other through a third switch 22. The switching means 10 is operable in at least two modes. In a first mode, the switch control 16 is instructed by the CPU that a word of data, here comprising two bits, is required to be loaded into only one row of memory cells. The switch control 16 then closes switches 18 and 20 and opens switch 22. With the switch means 10 so configured, the two-bit word of data can be simply loaded into the data input control, the required word line selected by the CPU and signaled by the row decoder 12, and the data input control signaled to store the two bits of data to the activated row of memory cells. In the first mode, the switching means enables two bits of data to be parallel stored either to the first row M0, M1 or the second row M2, M3 of memory cells.

In a second mode, the switch control 16 is instructed by the CPU that the two-bit word of data is required to be stored to portions of two adjacent rows of memory cells. In the 2×2 array of FIG. 1, such a situation would occur when the first bit of data was required to be stored in memory cell M1 and the second bit of data into memory cell M2. As discussed above, such operations were not efficient under prior art constraints. In the second mode, the switch control 16 opens switches 18 and 20 and closes switch 22. With the switch means 10 so configured, the word line signal path along word line WL0 is altered to access not only the first portion of the first row of memory cells, enabling activation of memory cells M1 but not M0, but also the second portion of the second row of memory cells through switch 22, enabling activation of memory cell M2 but not M3. Thus, with the switching means in the second mode of operation, when word line WL0 is signaled, alternate portions of two adjacent rows of memory cells are accessed, allowing the two bits of data to be parallel stored to the correct memory cells during a single CPU write cycle. Before the two bits of data can be parallel stored, however, the data input control circuit 14 must shift and realign the data so that the first bit of data is stored to memory cell M1 via data line DL1. A barrel shifter may be used to perform this function.

Figure 2:
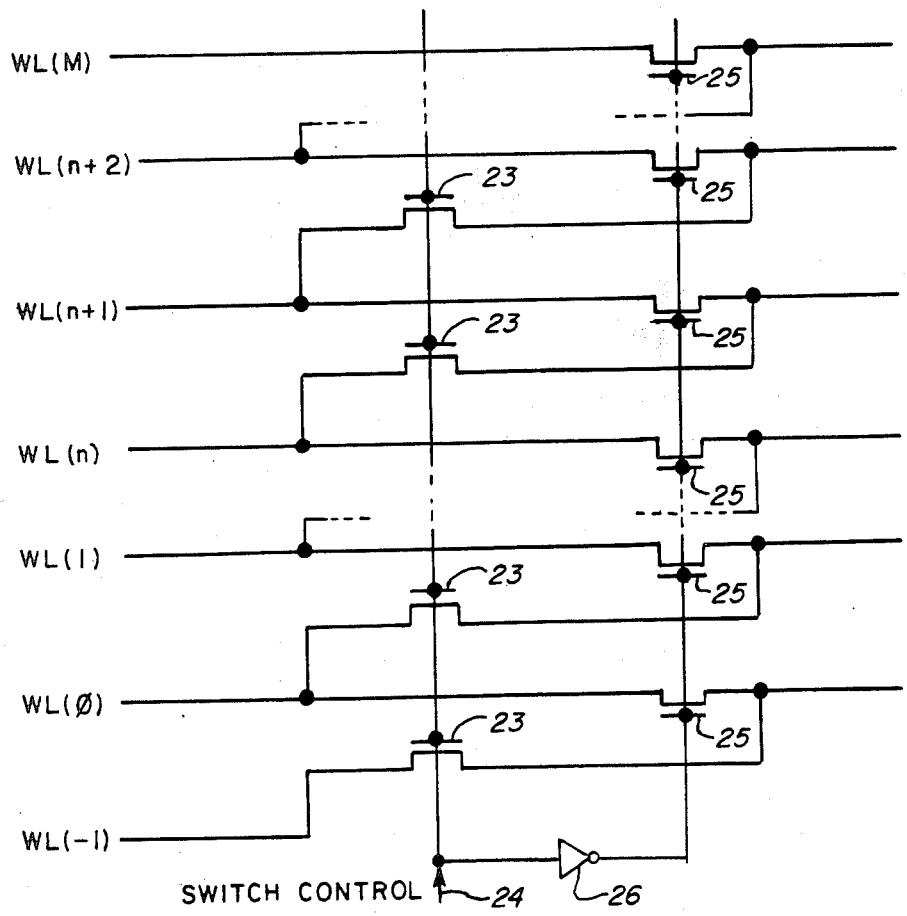
FIG. 2 is an illustrative circuit diagram of a preferred embodiment of the inventive switching means shown in FIG. 1.

Shown in FIG. 2 is an illustrative MOS transistor circuit diagram of one configuration of the switching means 10 suitable for use in RAM array comprising many more rows of memory cells. A control line 24 from the switch control circuit 16 provides the necessary voltage to activate and/or deactivate the switch transistors. If the switching means 10 is required to operate in accordance with the first mode described above, then the switch control 16 transmits a low voltage, or logical zero state, on the control line 24. The logical zero on the control line 24 drives the gate of transistor 23, low, thereby turning off transistor 23 and breaking the word line signal path between word lines WL(n) and WL(n+1). In this discussion, the enabled word line is assumed to be WL(n). The control line 24 is coupled to the gates of transistors 25 through an inverter 26. The inverter 26 converts the logical zero on control line 24 to high voltage, or logical one state, thereby providing sufficient drive to turn on transistors 25, and closing the normal word line signal paths along word lines WL(n) and WL(n+1).

If, on the other hand, the switching means 10 is required to operate in the second mode, discussed above, then the switch control 16 transmits a logical one voltage on control line 24, thereby providing sufficient drive at the gate of transistor 23 to close the word line signal path between word line WL(n) and WL(n+1). The logical one on the control line 24 is inverted at 26 to drive the gates of transistors 25 low, thereby breaking the normal word line signal paths on word lines WL(n) and WL(n+1).

Figure 3:
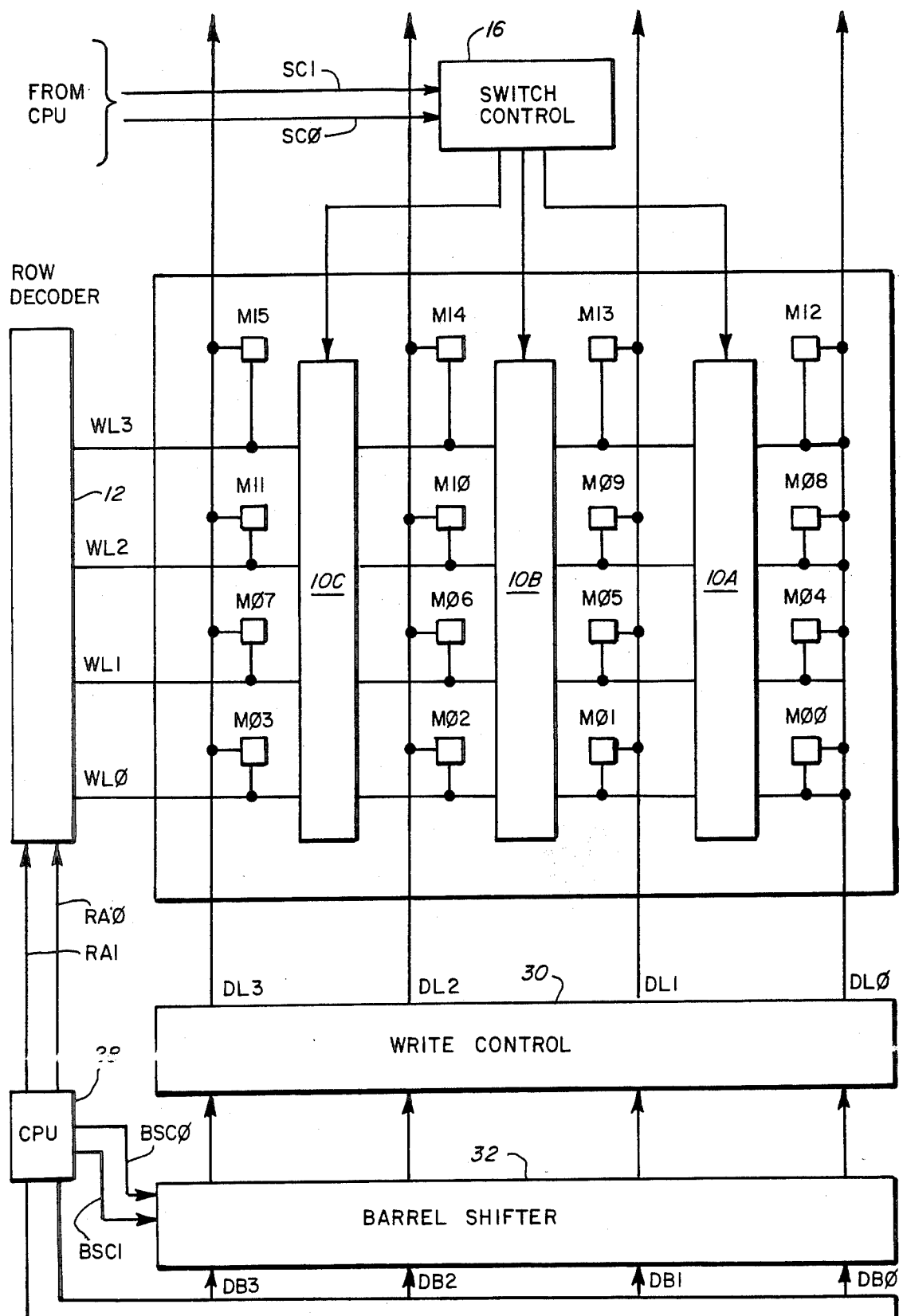
FIG. 3 schematically depicts a RAM array configured with another preferred embodiment of the inventive switching means interposed between each column of memory cells in a RAM array.

Referring now to FIG. 3, a larger RAM array is depicted with separate switching means 10A, 10B, 10C coupled to the word lines WL0 through WL3 between adjacent columsn of memory cells. The switching means 10A, 10B, 10C function similarly to the switching means 10 described above in reference to FIG. 1 and FIG. 2 to alter the word line signal paths to the rows of memory cells. In an alternate embodiment of the invention, the switching means 10A, 10B, and 10C may each comprise an addressable decoder coupled to the word lines WL0-WL3 between the columns of memory cells. Each addressable decoder 10A, 10B, 10C is selectively operable to access a portion of a first row of memory cells in the direction of one column and a portion of a second row of memory cells in the direction of the other column. The RAM array of FIG. 3 comprises four rows and four columns of memory cells. The use of the switching means 10A, 10B, 10C allows four bits of data to be efficiently parallel stored to alternate portions of at least two adjacent rows of memory cells in the 4×4 RAM array.

The data input control circuit 14 of FIG. 1 is shown in FIG. 3 to comprise a barrel shifter 32 to shift and realign the four bits of data from the CPU 28 with the appropriate columns of memory cells in response to a shift/enable address from the CPU 28 and write control 30, which permits writing to selective columns depending on the data bits.

In accordance with the embodiment shown in FIG. 3, the CPU controls the barrel shifter 32 with two control lines, BSC0 and BSC1. The barrel shifter can rotate the input data as shown in Table 1.

TABLE 1

| BSC1 | BSC00 | Operation |
|---|---|---|
| 0 | 0 | pass data |
| 0 | 1 | rotate word one bit left |
| 1 | 0 | rotate word two bits left |
| 1 | 1 | rotate word three bits left |

Barrel shifters of this type are well known in the prior art. The CPU also controls the row decoder 12 with two address lines, RA0 and RA1. The rwo decoder selectively activates one of the word lines in accordance with Table 2.

TABLE 2

| RA1 | RA00 | WL0 | WL1 | WL2 | WL3 |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |

TABLE 2-continued

| RA1 | RA00 | WL0 | WL1 | WL2 | WL3 |
|---|---|---|---|---|---|
| 1 | 1 | 0 | 0 | 0 | 1 |

The switch control 16 is controlled by the CPU with two control lines, SC1 and SC0. The switch control selectively activates one of the three switching means in accordance with Table 3.

TABLE 3

| SC1 | SC00 | Operation |
|---|---|---|
| 0 | 0 | no switching |
| 0 | 1 | switch 10A |
| 1 | 0 | switch 10B |
| 1 | 1 | switch 10C |

The CPU can cause the new word of data DB0-DB3 to be written into the RAM such that the first bit of the new data DB0 is written into any of the sixteen locations of the memory array. For example, DB0 may be written to M07, and thus DB1 is written into M08, DB2 into M09, and DB3 into M10. The various signals which the CPU must control in order to align the first bit of the new word of data, DB0, with each of the sixteen locations is shown in Table 4.

TABLE 4

| Align DB00 With | RA1 | RA00 | BSC1 | BSC00 | SC1 | SC00 |
|---|---|---|---|---|---|---|
| M00 | 0 | 0 | 0 | 0 | 0 | 0 |
| M01 | 0 | 0 | 0 | 1 | 0 | 1 |
| M02 | 0 | 0 | 1 | 0 | 1 | 0 |
| M03 | 0 | 0 | 1 | 1 | 1 | 1 |
| M04 | 0 | 1 | 0 | 0 | 0 | 0 |
| M05 | 0 | 1 | 0 | 1 | 0 | 1 |
| M06 | 0 | 1 | 1 | 0 | 1 | 0 |
| M07 | 0 | 1 | 1 | 1 | 1 | 1 |
| M08 | 1 | 0 | 0 | 0 | 0 | 0 |
| M09 | 1 | 0 | 0 | 1 | 0 | 1 |
| M10 | 1 | 0 | 1 | 0 | 1 | 0 |
| M11 | 1 | 0 | 1 | 1 | 1 | 1 |
| M12 | 1 | 1 | 0 | 0 | 0 | 0 |
| M13 | 1 | 1 | 0 | 1 | 0 | 1 |
| M14 | 1 | 1 | 1 | 0 | 1 | 0 |
| M15 | 1 | 1 | 1 | 1 | 1 | 1 |

In such a configuration, BSC1=SC1 and BSC0=SC0. Further, the four control lines RA1, RA0, BSC1, BSC0 represent the binary value of the particular memory location which DB0 is written into.

In the embodiment of FIG. 3, the data word DB0-DB3 represents four pixels of graphics. Some of these pixels may in fact be "blank" or "transparent." That is, whatever data is currently in the RAM at the corresponding locations should remain there. The write control 30 looks at the pixel data and selectively enables the columns DL0-DL3 for only those pixels which are non-zero, that is, not blank. Such an operation obviates the need for a read-modify-write cycle as exemplified in the prior art, since prior art systems had no such selective column control.

Figure 4:
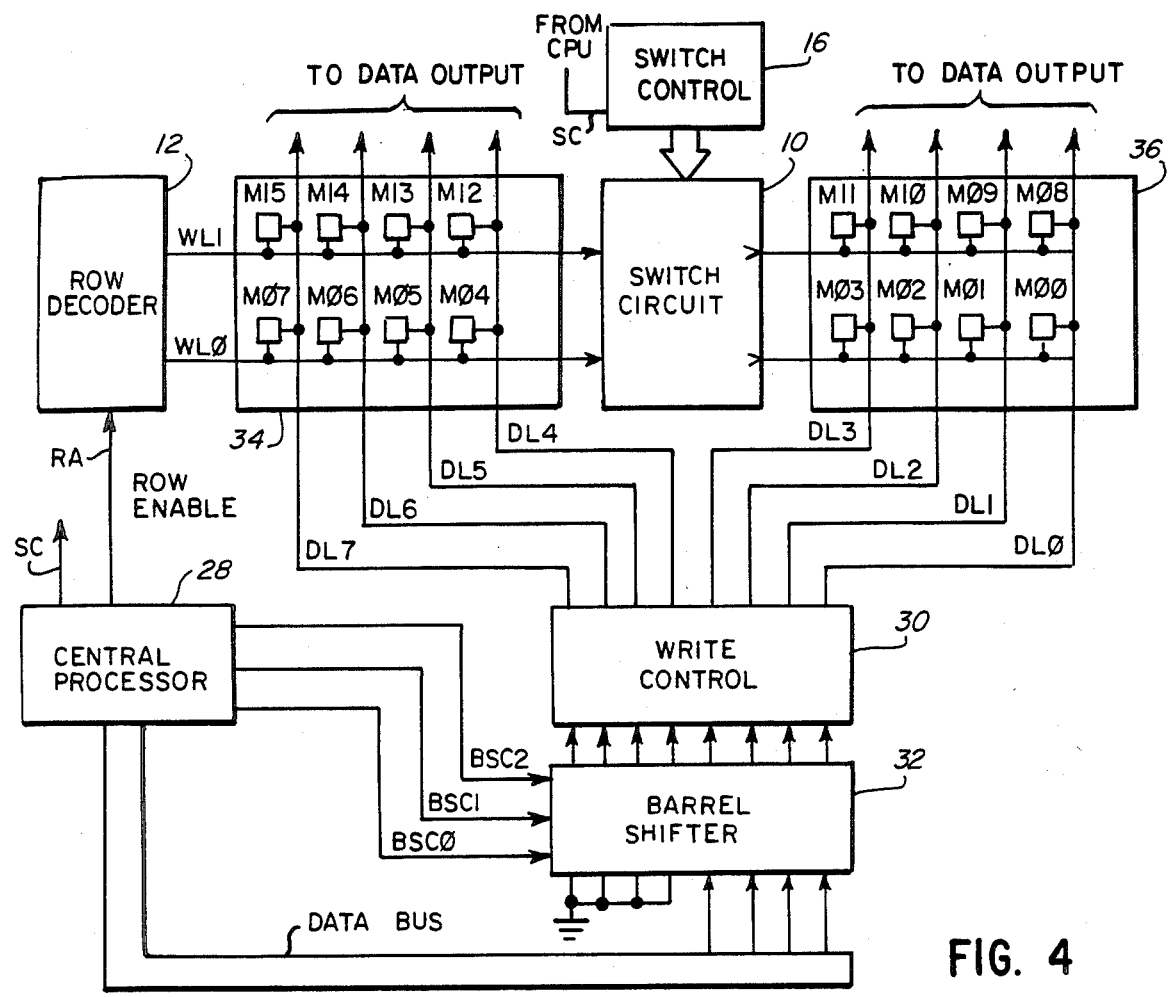
FIG. 4 depicts a further embodiment of the inventive switching means interposed between adjacent RAM arrays.

Referring now to FIG. 4, an alternate embodiment of a RAM system is shown incorporating the concepts and features of the inventive switching means 10. In comparison to the single 4×4 array of FIG. 3, which required at least three separate switching means 10A, 10B and 10C in order to achieve optimal flexibility and efficiency in processing data through the RAM system, the RAM system of FIG. 4 depicts two separate 2×4 RAM arrays 34, 36 having twice as many columns of memory cells as rows, but requiring only one switching means 10 to achieve optimal performance. The total number of memory cells in the two 2×4 RAM arrays has not increased over the total number of memory cells in the single 4×4 RAM array.

Operation of the RAM system of FIG. 4 is essentially the same as the system discussed above in reference to FIG. 3. The row decoder 12 is now controlled by a single signal RA, which when low enables WLØ and when high enables WL1. The switch control 16 is controlled by the CPU 28 with a single signal SC, which when high causes the switch circuit 10 to behave in the second mode in accordance with principles discussed above in reference to FIG. 2. The barrel shifter 32 now can either pass or rotate the input word up to seven bits left, and is controlled by the CPU 28 with three signals BSCØ, BSC1, BSC2 as shown in Table 5. Further, the barrel shifter 32 has four additional inputs tied to a low voltage, representing "blank" or "transparent" pixels.

paths to access alternate rows of memory cells in the pair of RAM arrays 34, 36. For example, and as discussed above, if the switching means comprises an addressable decoder coupled to the word lines between the first and second RAM arrays, such decoder would be selectively operable to access one row of memory cells (e.g., M12–M15) in the first RAM array 34 and a second row of memory cells (e.g., MØØ–MØ3) in the second RAM array 36.

Figure 4A:
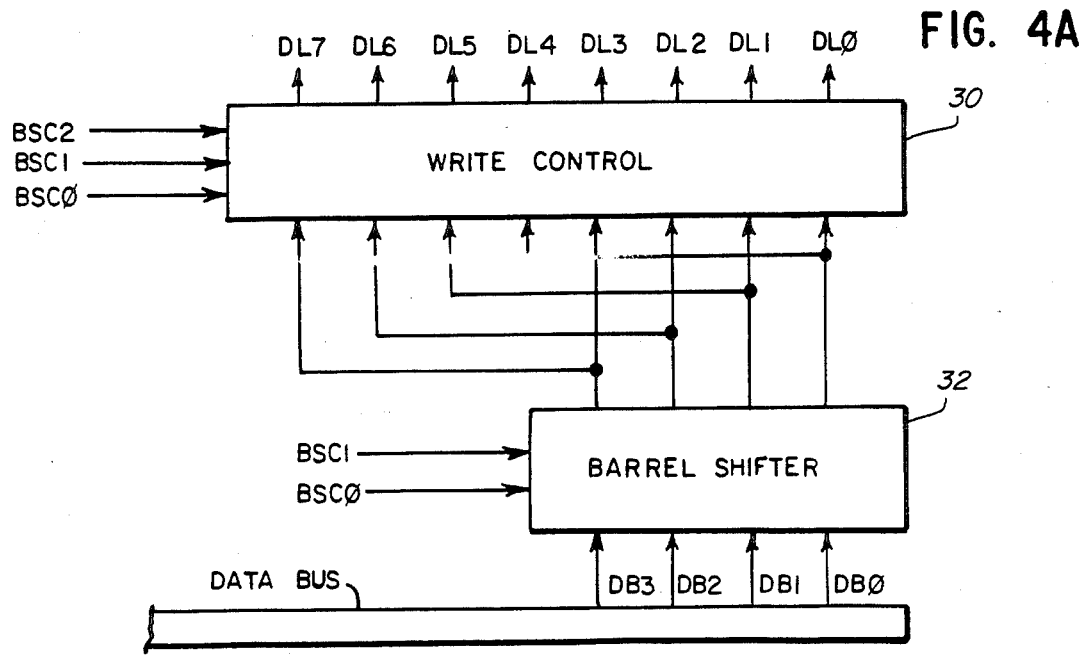
FIG. 4A is an alternative embodiment of the write-control and barrel shifter shown above in FIG. 4.

FIG. 4A illustrates an alternative embodiment of the input section of the apparatus discussed above in reference to FIG. 4. The barrel shifter circuit 32 rotates the input data as shown above in Table 1. The write control circuit 30 responds to control signals BSCØ, BSC1 and BSC2 from the central processor to disable writing to the data lines as shown in Table 7, where the letter D indicates that a particular data line is disabled.

TABLE 7

| BSC2 | BSC1 | BSC0 | DL7 | DL6 | DL5 | DL4 | DL3 | DL2 | DL1 | DL0 |
|---|---|---|---|---|---|---|---|---|---|---|
| 0 | 0 | 0 | D | D | D | D | | | | |
| 0 | 0 | 1 | D | D | D | | | | | D |
| 0 | 1 | 0 | D | D | | | | | D | D |
| 0 | 1 | 1 | D | | | | | D | D | D |
| 1 | 0 | 0 | | | | | D | D | D | D |
| 1 | 0 | 1 | | | | D | D | D | D | D |
| 1 | 1 | 0 | | | D | D | D | D | | |
| 1 | 1 | 1 | | D | D | D | D | | | |

TABLE 5

| BSC2 | BSC1 | BSC00 | Operation |
|---|---|---|---|
| 0 | 0 | 0 | pass data |
| 0 | 0 | 1 | rotate word one bit left |
| 0 | 1 | 0 | rotate word two bits left |
| 0 | 1 | 1 | rotate word three bits left |
| 1 | 0 | 0 | rotate word four bits left |
| 1 | 0 | 1 | rotate word five bits left |
| 1 | 1 | 0 | rotate word six bits left |
| 1 | 1 | 1 | rotate word seven bits left |

The various signals which the CPU must control in order to align the first bit of the new word of data DBØ with each of the sixteen locations is shown in Table 6.

TABLE 6

| Align DB00-With | RA | BSC2 | BSC1 | BSC00 | SC |
|---|---|---|---|---|---|
| M00 | 0 | 0 | 0 | 0 | 0 |
| M01 | 0 | 0 | 0 | 1 | 0 |
| M02 | 0 | 0 | 1 | 0 | 0 |
| M03 | 0 | 0 | 1 | 1 | 0 |
| M04 | 0 | 1 | 0 | 0 | 1 |
| M05 | 0 | 1 | 0 | 1 | 1 |
| M06 | 0 | 1 | 1 | 0 | 1 |
| M07 | 0 | 1 | 1 | 1 | 1 |
| M08 | 1 | 0 | 0 | 0 | 0 |
| M09 | 1 | 0 | 0 | 1 | 0 |
| M10 | 1 | 0 | 1 | 0 | 0 |
| M11 | 1 | 0 | 1 | 1 | 0 |
| M12 | 1 | 1 | 0 | 0 | 1 |
| M13 | 1 | 1 | 0 | 1 | 1 |
| M14 | 1 | 1 | 1 | 0 | 1 |
| M15 | 1 | 1 | 1 | 1 | 1 |

In such a configuration, BSC2=SC. Further, the four control lines RA, BSC2, BSC1, BSCØ represent the binary value of the particular memory location which DBØ is written into.

In its preferred form, the switching means 10 may comprise an addressable decoder, a series of transistor switches as exemplified in FIG. 2, or any other conceivable means for effectively altering the word line signal The data lines not disabled as shown in Table 7 are selectively enabled by the write control 30 only if the pixel data to be written represents a pixel which is nonzero, that is, not blank.

Figure 5:
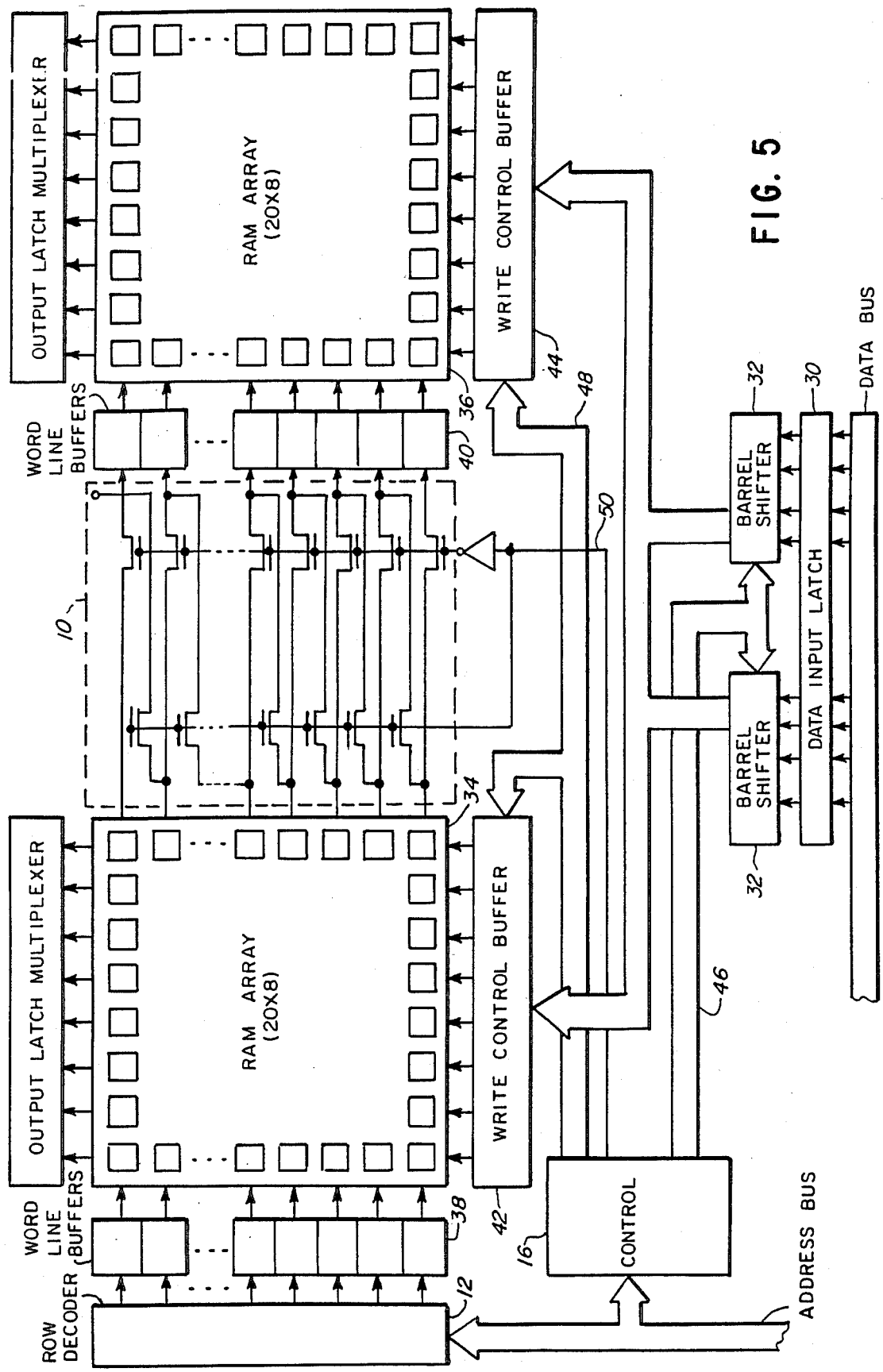
FIG. 5 is an illustrative circuit diagram of a preferred embodiment of the inventive switching means shown in FIG. 4.

Shown in FIG. 5 is a much larger and more detailed RAM system incorporating the principles of the invention as discussed above in relation to FIG. 4. Each RAM array 34, 36 comprises eight columns by twenty rows of one bit memory cells. The switching means 10 comprises a series of the transistor switches shown above in FIG. 2 coupled to each other and the plural word lines between the two RAM arrays 34, 36. The rows of memory cells in the RAM arrays 34, 36 are coupled to the plural word lines from the row decoder 12 through word line buffers 38, 40, respectively. The columns of memory cells in RAM arrays 34, 36 are coupled to the data input latch 30 through write control buffers 42, 44, respectively, and through the two barrel shifters 32.

Since each RAM array 34, 36 comprises eight columns of memory cells, it is possible to parallel store eight bits of data simultaneously. In this case the eight bits represent four pixels of graphics data. Generally, the eight bits of data are loaded into the data input latch 30 from the CPU or directly from an external memory if Direct Memory Access (DMA) techniques are employed. The CPU, or alternately a DMA controller if DMA techniques are employed, places an address on the address but which represents the particular memory location that the first pixel of the new graphics data should be written to. The control circuit 16 sends out control signals 46 to the barrel shifters 32 in accordance with principles discussed above in reference to FIG. 4A. The control circuit 16 sends out column disable signals 48 to the write control buffers 42, 44 in accordance with principles discussed above in reference to FIG. 4A. Further, the write control buffers 42, 44 may further disable columns if the corresponding pixel data represents a blank or transparent pixel. The control circuit 16 sends out switch control signal 50 to the switching means 10 in accordance with principles discussed above in reference to FIG. 4.

It will be understood by those skilled in the art that numerous alternate forms and embodiments of the invention can be devised without departing from its spirit and scope. The features of the invention deemed novel are set forth below in the claims.

What is claimed is:

1. A method for processing a word of data bits corresponding to video graphics information through a random access memory array of a video display system, the random access memory array including rows and columns of memory cells joined by word and data lines and having address locations corresponding to pixel locations along a video raster line, the method comprising the steps of:
    (a) determining the pixel locations along the video raster line at which the word of graphics information is to be displayed;
    (b) determining whether the memory cells of the RAM array which correspond to the determined pixel locations occupy overlapping word boundaries in portions of two rows of memory cells of the RAM array;
    (c) activating a switching circuit to selectively later a word line path to allow simultaneous accessing of the portions of the rows of memory cells corresponding to the overlapping word boundaries;
    (d) signaling the altered word line path to simultaneously access the portions of the rows of memory cells corresponding to the overlapping word boundaries;
    (e) aligning the first bit of the word of data with the first memory cell determined to correspond to the first pixel location; and
    (f) enabling the data lines coupled to the memory cells to simultaneously process the word of data bits to the portions of the rows of memory cells corresponding to the overlapping word boundaries.

2. A method for processing a word of data bits corresponding to video graphics information through arbitrary word boundaries in a random access memory array of a video display system, the random access memory array including rows and columns of memory cells coupled to word and data lines, respectively, and the memory cells of the random access memory array having address locations corresponding to pixel locations along a video raster line, the method comprising the steps of:
    (a) determining the pixel locations along the video raster line at which the display information is to be displayed;
    (b) determining whether the memory cells of the RAM array which correspond to the determined pixel locations occupy portions of more than one word boundary in the RAM array;
    (c) activating a switching circuit to selectively alter a word line path to the rows of memory cells to allow simultaneous accessing of portions of plural word boundaries corresponding to the determined memory cells;
    (d) signaling the altered word line path to simultaneously access the portions of the word boundaries corresponding to the determined memory cells;
    (e) aligning the first bit of the word of data with the memory cell determined to correspond to the first pixel location; and
    (f) enabling data lines coupled to the columns of memory cells to simultaneously process the word of data bits to the portions of plural word boundaries determined to correspond to the locations along the video raster lines at which the video information is to be displayed.

3. A device for processing a word of data bits corresponding to video graphics information through a random access memory array of a video display system, the random access memory array including rows and columns of memory cells joined by word and data lines and having address locations corresponding to pixel locations along a video raster line, the device comprising:
    (a) means for determining the pixel locations along the video raster line at which the word of graphics information is to be displayed;
    (b) means for determining whether the memory cells of the RAM array which correspond to the determined pixel locations occupy overlapping word boundaries in portions of two rows of memory cells in the RAM array;
    (c) switching means for selectively altering a word line path to allow simultaneously accessing of the portions of the rows of memory cells corresponding to the overlapping word boundaries;
    (d) means for signaling the altered word line path to simultaneously access the portions of the rows of memory cells corresponding to the overlapping word boundaries;
    (e) means for aligning the first bit of the word of data with the first memory cell determined to correspond to the first pixel location; and
    (f) means for enabling the data lines coupled to the memory cells to simultaneously process the word of data bits to the portions of the rows of memory cells corresponding to the overlapping word boundaries.

4. A device for processing a word of data bits corresponding to video graphics information through arbitrary word boundaries in a random access memory array of a video display system, the random access memory array including rows and columns of memory cells coupled to word and data lines, respectively, and the memory cells of the random access memory array having address locations corresponding to pixel locations along a video raster line, the device comprising:
    (a) means for determining the pixel locations along the video raster line at which the display information is to be displayed;
    (b) means for determining whether the memory cells of the RAM array which correspond to the determined pixel locations occupy portions of more than one word boundary in the RAM array;
    (c) switching means for selectively altering a word line path to the rows of memory cells to allow simultaneous accessing of portions of plural word boundaries correspond to the determined memory cells;
    (d) means for signaling the altered word line path to simultaneously access the portions of the word boundaries corresponding to the determined memory cells;
    (e) means for aligning the first bit of the word of data with the memory cell determined to corresponding to the first pixel location; and (f) means for enabling data lines coupled to the columns of memory cells to simultaneously process the word of data bits to the portions of plural word boundaries determined to correspond to the locations along the video raster lines at which the video information is to be displayed.

5. An apparatus for processing a sequence of data bits through selected memory cells located at arbitrary word boundaries in a random access memory (RAM) system, the random access memory system having a plurality of rows and columns of memory cells forming a RAM array, plural word lines coupled to respective rows of memory cells, and plural data lines coupled to respective columns of memory cells, the apparatus comprising:
   (a) switching means coupled to the word lines between adjacent columns of memory cells for selectively altering the word line signal paths between the adjacent columns of memory cells to allow simultaneous accessing of the portions of adjacent rows of memory cells in the RAM array corresponding to the selected memory cells, the switching means being selectively operable in a plurality of modes, at least one of the modes causing a signal along any of the word lines to access only one row of memory cells, at least a second of the modes causing a signal along an altered word line to simultaneously access selected portions of adjacent rows of memory cells;
   (b) means for determining whether a word of data is to be stored to the RAM array in accordance with the second mode;
   (c) barrel shifting means for aligning the individual bits of the word of data with the selected memory cells of the RAM array; and
   (d) means for controlling the barrel shifting means and directing the number of shift operations required to align the word of data.

6. A random access memory system comprising:
   (a) two RAM rays with plural associated rows of memory cells and plural columns of memory cells;
   (b) word lines coupled to the associated rows of memory cells of both RAM arrays;
   (c) data lines coupled to respective columns of memory cells;
   (d) switching means coupled to the word lines between the associated RAM arrays for altering the word line paths to simultaneously access portions of different rows of memory cells of the RAM rays;
   (e) means for determining whether a word of data is to be simultaneously stored to selected memory cells in different rows in the RAM arrays;
   (f) barrel shifting means for aligning the individual bits of the word of data with the selected memory cells of the RAM arrays; and
   (g) means for controlling the barrel shifting means and directing the number of shift operations required to align the word of data with the selected memory cells of the RAM arrays.

7. A random access memory system comprising:
   (a) two RAM arrays with plural associated rows of memory cells and plural columns of memory cells;
   (b) word lines coupled to the associated rows of memory cells of both RAM arrays;
   (c) data lines coupled to respective columns of memory cells;
   (d) switching means coupled to the word lines between the associated RAM arrays for altering the word line paths to simultaneously access portions of different rows of memory cells of the RAM arrays, the switching means comprising an addressable decoder coupled to the word lines between the first and second RAM arrays and selectively operable to access a first row of memory cells in the first RAM array and a second row of memory cells in the second RAM array.

8. An apparatus for processing a sequence of data bits through selected memory cells located at arbitrary word boundaries in a random access memory (RAM) system, the random access memory system having a plurality of rows and columns of memory cells forming a RAM array, plural word lines coupled to respective rows of memory cells, and plural data lines coupled to respective columns of memory cells, the apparatus comprising:
   (a) switching means coupled to the word lines between adjacent columns of memory cells for selectively altering the word line signal paths between the adjacent columns of memory cells to allow simultaneous accessing of the portions of adjacent rows of memory cells in the RAM array corresponding to the selected memory cells, the switching means being selectively operable in a plurality of modes, at least one of the modes causing a signal along any of the word lines to access only one row of memory cells, at least a second of the modes causing a signal along an altered word line to simultaneously access selected portions of adjacent rows of memory cells;
   (b) means for determining whether a word of data is to be stored to the RAM array in accordance with the second mode;
   (c) means for determining the first memory cell of the RAM array in which the first bit of data is to be stored;
   (d) barrel shifting means for aligning the first bit of the word of data with the selected memory cell of the RAM array; and
   (e) means for controlling the barrel shifting means and directing the number of shift operations required to align the word of data with the selected memory cells of the RAM array.

9. The apparatus of claim 8 further comprising switch control means for instructing the switching means regarding which adjacent rows of memory cells are to be simultaneously accessed, the switch control means being responsive to the means for determining the first memory cell of the RAM array in which the first bit of data is to be stored.

10. A random access memory system comprising:
   (a) two RAM arrays with plural associated rows of memory cells and plural columns of memory cells;
   (b) word lines coupled to the associated rows of memory cells of both RAM arrays;
   (c) data lines coupled to respective columns of memory cells;
   (d) switching means coupled to the word lines between the associated RAM arrays for altering the word line paths to simultaneously access portions of different rows of memory cells of the RAM arrays;
   (e) means for determining whether a word of data is to be simultaneously stored to overlapping word boundaries in different rows of memory cells in the RAM arrays;

(f) means for determining the location of the first memory cell of the associated RAM arrays in which the first bit from the word of data is to be stored;

(g) barrel shifting means for aligning the first bit of the word of data with the memory cell of the associated RAM arrays which was determined to correspond thereto; and (h) means for controlling the barrel shifting means and directing the number of shift operations required to align the word of data with the corresponding memory cells in overlapping word boundaries of different rows of the associated RAM arrays.

* * * * *